(12) United States Patent
Ishikawa et al.

(10) Patent No.: US 10,283,706 B2
(45) Date of Patent: May 7, 2019

(54) MEMORY DEVICE (71) Applicant: TOSHIBA MEMORY CORPORATION, Minato-ku, Tokyo (JP)

(72) Inventors: Takayuki Ishikawa, Yokkaichi Mie (JP); Sanggyu Koh, Uji Kyoto (JP); Tetsu Morooka, Yokkaichi Mie (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 15/705,074

(22) Filed: Sep. 14, 2017

(65) Prior Publication Data
US 2018/0269392 A1 Sep. 20, 2018

(30) Foreign Application Priority Data

Mar. 17, 2017 (JP) .................. 2017-053496

(51) Int. Cl.
H01L 27/24 (2006.01)
H01L 45/00 (2006.01)

(52) U.S. Cl.
CPC ........ H01L 45/1246 (2013.01); H01L 27/249 (2013.01); H01L 27/2454 (2013.01); H01L 45/085 (2013.01); H01L 45/146 (2013.01); H01L 45/1616 (2013.01)

(58) Field of Classification Search
CPC . H01L 45/1246; H01L 45/146; H01L 45/085; H01L 27/249; H01L 27/2454
See application file for complete search history.

(56) References Cited

U.S. PATENT DOCUMENTS

| 8,299,571 | B2 | 10/2012 | Ozawa et al. |
| 8,664,632 | B2 | 3/2014 | Matsushita et al. |
| 2015/0255512 | A1* | 9/2015 | Takagi .................. H01L 45/146 257/4 |

FOREIGN PATENT DOCUMENTS

| JP | 2011-129639 A | 6/2011 |
| JP | 2013-197523 A | 9/2013 |

* cited by examiner

Primary Examiner — Allen L Parker
Assistant Examiner — Gustavo G Ramallo
(74) Attorney, Agent, or Firm — Foley & Lardner LLP (57) ABSTRACT A memory device includes first interconnects extending in a first direction; a second interconnect extending in a second direction crossing the first interconnects; an insulating film provided between two first interconnects; and a resistance change film between the first interconnects and the second interconnect. The resistance change film includes a first layer and second layers, the first layer extending in the second direction along the second interconnect, and the second layers being provided selectively between the respective first interconnects and the first layer. The second layers protrude toward the second interconnect exceeding an end surface of the insulating film in a third direction from the respective first interconnects toward the second interconnect. The respective second layers have a surface on a side of the first interconnects, and a width in the second direction of the surface is wider than a width in the second direction of the first interconnect.

3 Claims, 8 Drawing Sheets

MEMORY DEVICE

CROSS-REFERENCE TO RELATED APPLICATIONS

This application is based upon and claims the benefit of priority from Japanese Patent Application No. 2017-053496, filed on Mar. 17, 2017; the entire contents of which are incorporated herein by reference.

FIELD

Embodiments generally relate to a memory device.

BACKGROUND

There is a memory device including, for example, resistance change type memory cells which are three-dimensionally disposed. The resistance change type memory cells are disposed respectively, for example, in portions where a bit line crosses a plurality of word lines. Then, each memory cell includes a portion which is a part of a resistance variable film extending along the bit line and positioned between the bit line and each word line. In the memory device having such a structure, a leakage current between the word lines becomes large in some cases, which are connected to the memory cells sharing the resistance variable film.

DETAILED DESCRIPTION

According to one embodiment, a memory device includes a plurality of first interconnects extending in a first direction; a second interconnect extending in a second direction crossing the plurality of first interconnects; an insulating film provided between two first interconnects of the plurality of first interconnects, the two first interconnects being adjacent to each other in the second direction; and a resistance change film provided between the plurality of first interconnects and the second interconnect. The resistance change film reversibly transits between a first resistance state and a second resistance state having a resistance higher than a resistance in the first resistance state. The resistance change film includes a first layer and second layers, the first layer extending in the second direction along the second interconnect, and the second layers being provided selectively between the respective first interconnects and the first layer. The first layer includes first portions positioned between the respective first interconnects and the second interconnect, and a second portion positioned between the insulating film and the second interconnect. The second layers are provided to protrude toward the second interconnect exceeding a level of an end surface of the insulating film in a third direction from the respective first interconnects toward the second interconnect. The respective second layers have a surface on a side of the first interconnects, and a width in the second direction of the surface is wider than a width in the second direction of the first interconnect.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

Figure 1:
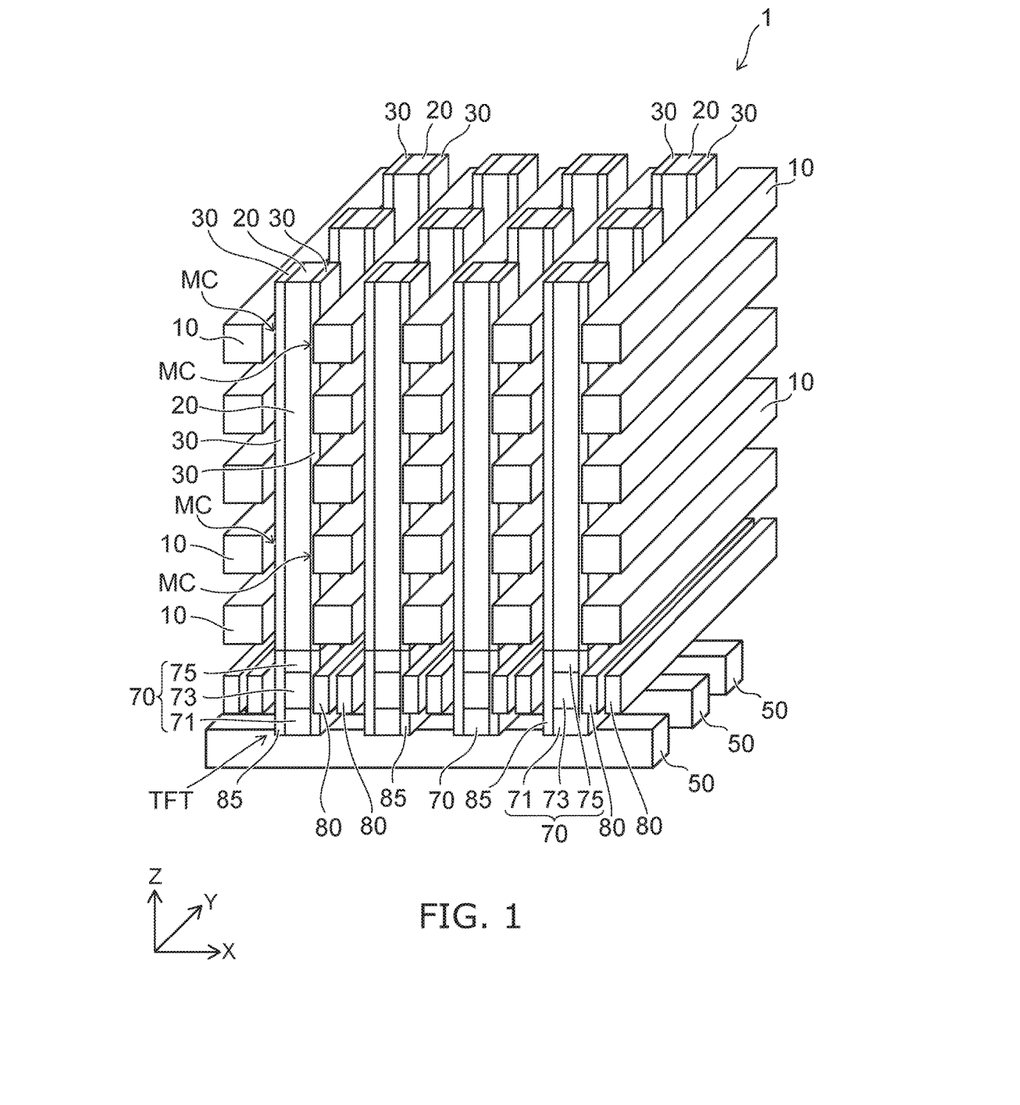
FIG. 1 is a perspective view showing a memory device according to a first embodiment.

FIG. 1 is a perspective view showing a memory device 1 according to a first embodiment. The memory device 1 is a non-volatile memory device including three-dimensionally disposed resistance change type memory cells MC. The memory device 1 includes a plurality of word lines 10, a local bit line 20, and a resistance change film 30.

As shown in FIG. 1, the plurality of word lines 10 each extends in the Y-direction, and is arranged in the Z-direction. The local bit line 20 crosses the plurality of word lines 10, and extends in the Z-direction. The resistance change film 30 extends in the Z-direction along the local bit line 20, and includes a portion positioned between the word line 10 and the local bit line 20. Note that insulating films provided between respective interconnects are omitted in FIG. 1 for convenience in showing the structure of the memory device 1.

The memory device 1 further includes a plurality of global bit lines 50 extending in the X-direction. The global bit lines 50 are arranged in the Y-direction. The plurality of local bit lines 20 are connected to the global bit lines 50 via TFTs (Thin Film Transistors) respectively. The plurality of word lines 10 are arranged in the Z-direction along the local bit line 20 above the global bit lines 50.

The respective TFTs include a semiconductor layer 70, a gate electrode 80, and a gate insulating film 85. The semiconductor layer 70 extends in the Z-direction, and includes a drain region 71, a channel region 73, and a source region 75. The gate electrode 80 is provided on both sides of the semiconductor layer 70 in the X-direction, and faces the channel region 73 via the gate insulating film 85. Further, the gate electrode 80 extends in the Y-direction and is shared by a plurality of TFTs.

A memory cell MC is provided in each portion where a word line 10 crosses the local bit line 20, and includes a part of the resistance change film 30. The memory cell MC is provided on both sides of the local bit line 20 in the X-direction. Further, the word line 10 is positioned between the local bit lines 20 adjacent to each other in the X-direction and is shared by the memory cells MC positioned on both sides thereof.

Figure 2:
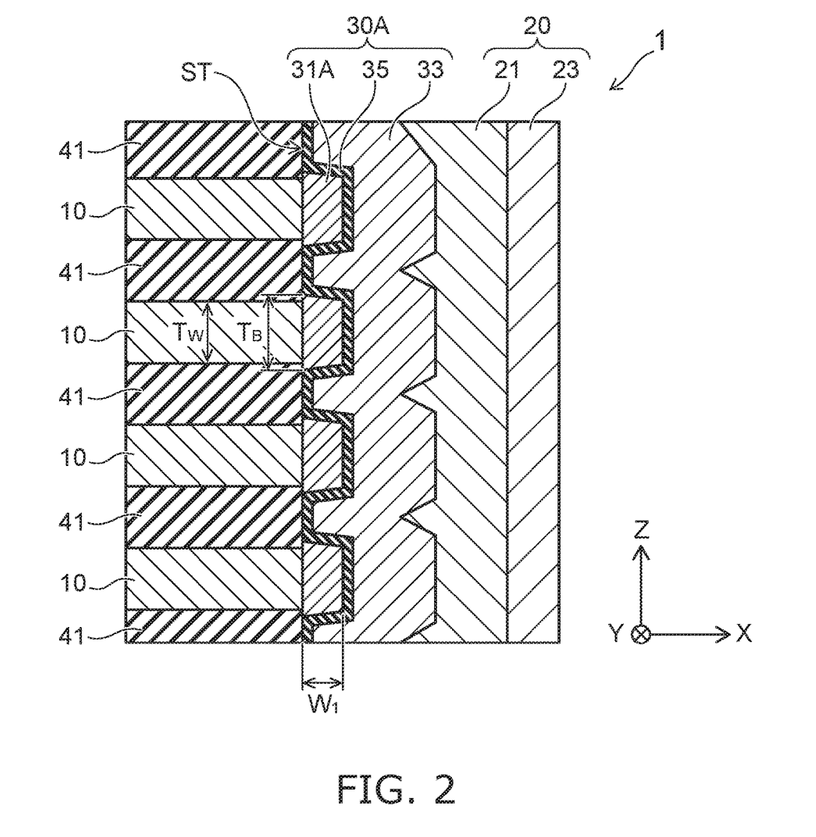
FIG. 2 is a schematic sectional view showing a part of the memory device according to the first embodiment.

FIG. 2 is a schematic sectional view showing a part of the memory device 1 according to the first embodiment. In FIG. 2, shown are a plurality of word lines 10 arranged in the Z-direction, a local bit line 20, and a resistance change film 30A.

As shown in FIG. 2, the plurality of word lines 10 are stacked in the Z-direction, for example, via an insulating film 41. The respective word lines 10 contain, for example, titanium nitride (TiN). The insulating film 41 contains, for example, silicon oxide.

The local bit line 20 extends in the Z-direction along the end surfaces of the word lines 10 and the insulating films 41. The local bit line 20 is provided in a slit ST which divides a stacked body including, for example, the word lines 10 and insulating films 41. The local bit line 20 includes, for example, a metal layer 21 and a conductive core 23 extending in the Z-direction. The metal layer 21 is positioned between the conductive core 23 and the resistance change film 30A, and extends in the Z-direction along the conductive core 23. The metal layer 21 contains, for example, TiN. The conductive core 23 contains, for example, silicon.

The resistance change film 30A is positioned between the word lines 10 and the local bit line 20, and includes barrier layers 31A, an oxide film layer 33, and an intermediate layer 35.

As shown in FIG. 2, the barrier layers 31A are selectively provided on end surfaces of the word lines 10 exposed on the inner wall of the slit ST. That is, the barrier layers 31A are arranged separately from each other on the inner wall of the slit ST. Further, the barrier layers 31A are provided so as to protrude toward the local bit line 20 from an end surface of an insulating film 41 in the X-direction. The respective barrier layers 31A contain, for example, amorphous silicon (α-Si). Further, the respective barrier layers 31A may contain at least one of silicon, silicon oxide, germanium, germanium oxide, aluminum oxide, and hafnium oxide.

The intermediate layer 35 is provided so as to cover the end surfaces of the insulating films 41 and the barrier layers 31A. The intermediate layer 35 contains, for example, an insulative metal oxide such as aluminum oxide $AlO_x$.

The oxide film layer 33 is positioned between the local bit line 20 and the intermediate layer 35, and is provided continuously in the Z-direction. The oxide film layer 33 contains, for example, titanium oxide ($TiO_2$) or tungsten oxide ($WO_3$). Further, the oxide film layer 33 includes a portion positioned between the local bit line 20 and a barrier layer 31A and other portion positioned between the local bit line 20 and an insulating film 41. The other portion positioned between the local bit line 20 and the insulating film 41 is in contact with the insulating film 41 via the intermediate layer 35.

Figure 3:
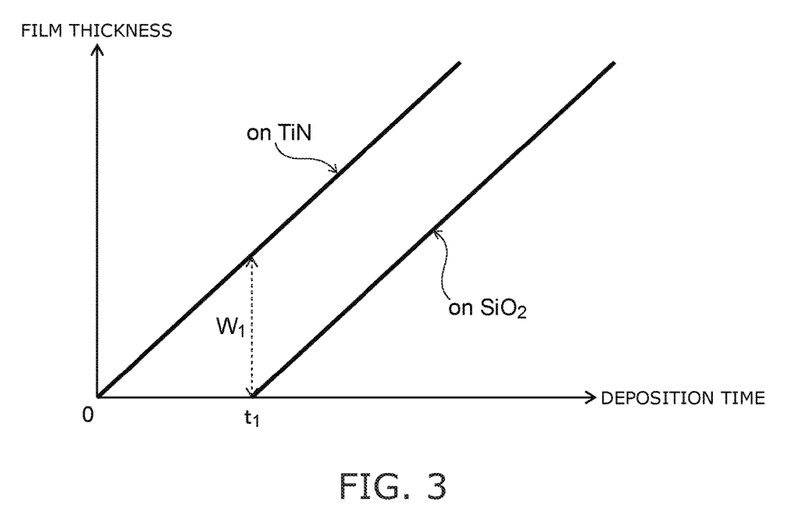
FIG. 3 is a schematic view showing a method for forming the resistance variable film according to the first embodiment.

FIG. 3 is a schematic view showing a method for forming the resistance change film 30A. FIG. 3 shows a method for selectively forming the barrier layer 31A on the end surface of the word line 10 exposed on the inner wall of the slit ST. In this example, an amorphous silicon (α-Si) layer is used as the barrier layer 31A. The α-Si layer can be formed, for example, using low pressure CVD (Chemical Vapor Deposition) using disilane ($Si_2H_6$) as a raw material.

In FIG. 3, the horizontal axis represents the deposition time of the α-Si layer, and the vertical axis represents the thickness of the α-Si layer. As shown in FIG. 3, the α-Si layer is formed such that the thickness of the α-Si layer deposited on TiN is different from the thickness of the α-Si layer deposited on silicon oxide ($SiO_2$). That is, by delaying the deposition start of the α-Si layer on $SiO_2$, the thickness of the α-Si layer deposited on TiN can be made thicker than that of the α-Si layer deposited on $SiO_2$.

Further, by setting the deposition time of the α-Si layer shorter than the so-called incubation time $t_1$, the α-Si layer is not deposited on $SiO_2$, and thus, is selectively deposited on TiN. Accordingly, it becomes possible to selectively form the barrier layer 31A on the end surface of the word line 10 that contains TiN. In the case where the α-Si layer is selectively deposited on TiN, the thickness $W_1$ thereof can be set, for example, in a range of 2.0 to 2.5 nanometers (nm). That is, the thickness $W_1$ (see FIG. 2) in the X-direction in the barrier layer 31A is, for example, not less than 2.0 nm and not more than 2.5 nm.

Further, the thickness $T_B$ in the Z-direction of the barrier layer 31A is formed thicker than the thickness $T_W$ in the Z-direction of the word line 10 (see FIG. 2). Thereby, as shown in FIG. 2, the barrier layer 31A is formed to have a cross-section of trapezoidal shape with a narrower width on a side of the oxide film layer 33, and thus, the step coverage of the oxide film layer 33 and the intermediate layer 35 can be improved.

Figure 4:
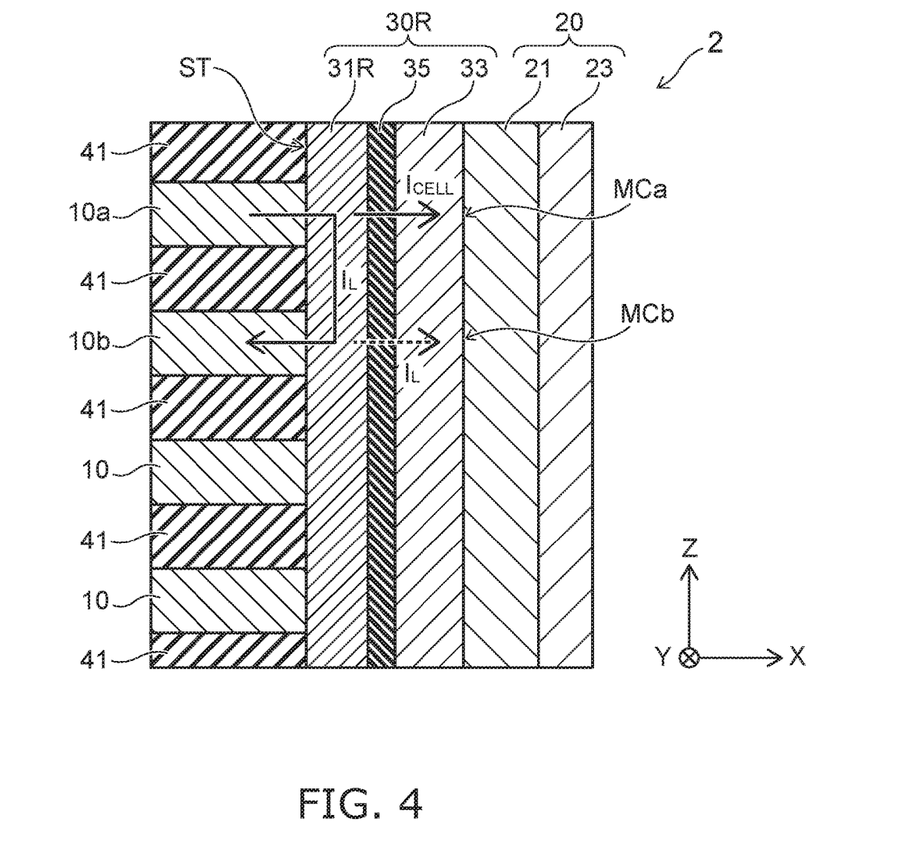
FIG. 4 is a schematic sectional view showing a part of a memory device according to a comparable example.

FIG. 4 is a schematic sectional view showing a part of a memory device 2 according to a comparable example. A resistance change film 30R of the memory device 2 includes a barrier layer 31R, an intermediate layer 35, and an oxide film layer 33. The barrier layer 31R is formed continuously on the inner wall of a slit ST. The barrier layer 31R is an α-Si layer, and the intermediate layer 35 is an $AlO_x$ layer. The oxide film layer 33 is a $TiO_2$ layer.

The barrier layer 31R has a higher resistance than the oxide film layer 33, and the intermediate layer 35 is an insulating layer. When the resistance change film 30R is in a low-resistance state, the resistance change film 30R exhibits its conductivity due to the electron tunneling, for example, from the oxide film layer 33 to a word line 10. The total thickness of the barrier layer 31R and the intermediate layer 35 is set to a thickness so that an electron can tunnel from the oxide film layer 33 to the word line 10.

For example, when the potential of the local bit line 20 is set higher than the potential of the word line 10, a negative oxygen ion in the oxide film layer 33 is attracted toward the local bit line 20. Thereby, an electronic state in the vicinity of an interface between the oxide film layer 33 and the intermediate layer 35 changes, and the electron tunneling through the barrier layer 31R and the intermediate layer 35 is suppressed. As a result, the resistance change film 30R transits from a low-resistance state to a high-resistance state.

In contrast, when the potential of the word line 10 is higher than the potential of the local bit line 20, a negative oxygen ion in the oxide film layer 33 moves toward the intermediate layer 35. Thereby, the electronic state in the vicinity of the interface between the oxide film layer 33 and the intermediate layer 35 changes so that an electron can tunnel through the barrier layer 31R and the intermediate layer 35. Thus, the resistance change film 30R transits from a high-resistance state to a low-resistance state.

As shown in FIG. 4, the barrier layer 31R is shared by the plurality of word lines 10 stacked in the Z-direction. Further, the barrier layer 31R is not an insulating layer. Therefore, when a potential difference occurs between the word lines 10 stacked in the Z-direction, a leakage current $I_L$ flows therebetween through the barrier layer 31R.

Furthermore, a memory cell MCa positioned between a word line 10a and the local bit line 20 is assumed to be in a high-resistance state, and a memory cell MCb positioned between a word line 10b adjacent to the word line 10a and the local bit line 20 is assumed to be in a low-resistance state. When data stored in the memory cell MCa positioned between the word line 10a and the local bit line 20 is read out, a read voltage $V_{READ}$ is applied between the word line 10a and the local bit line 20, and a cell current $I_{CELL}$ is detected, which flows through the memory cell MCa. At this time, since the memory cell MCb is in a low-resistance state, a leakage current $I_L$, which flows through the barrier layer 31R, is also detected as well as the cell current $I_{CELL}$. Thereby, the read out current is detected to be larger than the cell current $I_{CELL}$ that flows through the memory cell MCa in the high-resistance state, and there may be a case where the memory cell MCa is erroneously determined to be in a low-resistance state.

In contrast, in the memory device 1, the barrier layers 31A are provided separately from each other on the end surfaces of the word lines 10. Accordingly, the leakage current $I_L$ between the word lines 10 is suppressed, and erroneous reading can be avoided. Further, in the memory device 1, by suppressing a leakage current $I_L$ through the barrier layer 31A, the power consumption for operating the memory cell MC can be reduced. Moreover, the step coverage for the barrier layer 31A of the oxide film layer 33 and the intermediate layer 35 is improved by providing the barrier layer 31A having a trapezoidal section, thereby suppressing the variation in the cell current $I_{CELL}$.

Figure 5:
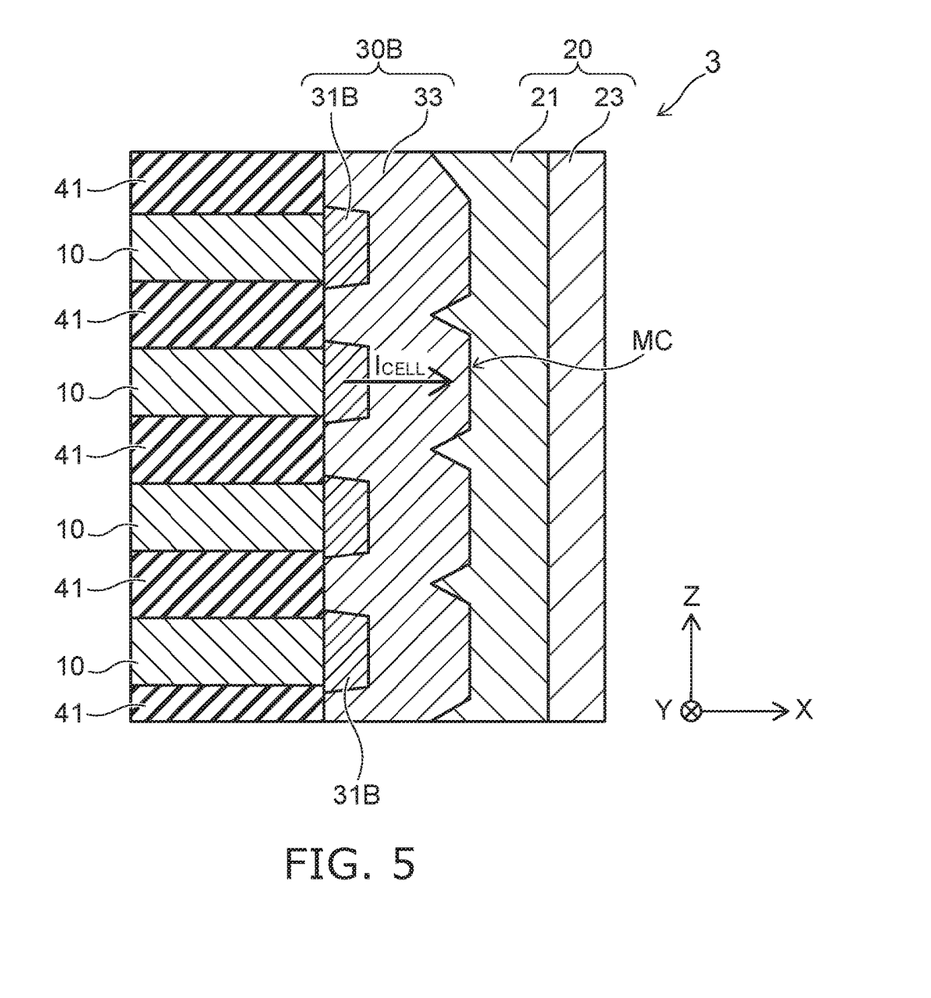
FIG. 5 is a schematic sectional view showing a part of a memory device according to a first variation of the first embodiment.

FIG. 5 is a schematic sectional view showing a part of a memory device 3 according to a first variation of the first embodiment. As shown in FIG. 5, the memory device 3 includes a resistance change film 30B positioned between a word line 10 and a local bit line 20.

The resistance change film 30B includes a plurality of barrier layers 31B and an oxide film layer 33. The barrier layers 31B are arranged separately from each other on the end surfaces of the word lines 10. Each barrier layer 31B is provided so as to protrude toward the local bit line 20 from the end surface of an insulating film 41 in the X-direction. The barrier layers 31B are, for example, α-Si layers. Further, each barrier layer 31B may contain at least one of silicon, silicon oxide, aluminum oxide, and hafnium oxide.

In this example, an intermediate layer 35 is not provided, and the oxide film layer 33 is in contact with the barrier layer 31B. Further, the oxide film layer 33 is in contact with the insulating film 41 between the local bit line 20 and the insulating film 41. Thereby, a leakage current $I_L$ (see FIG. 4) between the word lines 10 can be suppressed, and also a cell current $I_{CELL}$ flowing through the memory cell MC can be made large. Moreover, each barrier layer 31B is formed to have a cross-section of trapezoidal shape, and the step coverage of the oxide film layer 33 is improved, thereby suppressing the variation in the cell current $I_{CELL}$. As a result, it is possible to improve the accuracy of reading data out from the memory cell MC.

Figure 6:
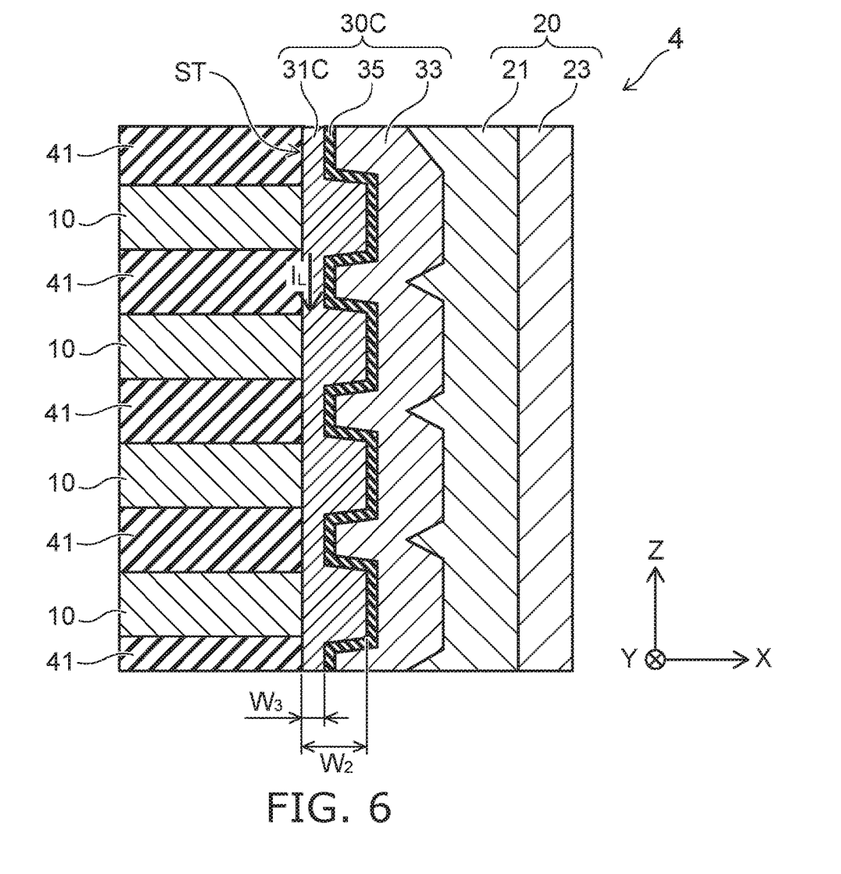
FIG. 6 is a schematic sectional view showing a part of a memory device 4 according to a second variation of the first embodiment.

FIG. 6 is a schematic sectional view showing a part of a memory device 4 according to a second variation of the first embodiment. As shown in FIG. 6, the memory device 4 includes a resistance change film 30C positioned between a word line 10 and a local bit line 20.

The resistance change film 30C includes a barrier layer 31C, an oxide film layer 33, and an intermediate layer 35. The barrier layer 31C is, for example, provided continuously on the wall surface of a slit ST, and has a thickness $W_2$ on the end surface of the word line 10 and a thickness $W_3$ on the end surface of an insulating film 41 different from the thickness $W_2$. The barrier layer 31C is, for example, an α-Si layer. Further, the barrier layer 31C may contain at least one of silicon, silicon oxide, aluminum oxide, and hafnium oxide.

The barrier layer 31C is formed, for example, under conditions that the deposition thereof on the end surface of the insulating film 41 is started later than the deposition thereof on the end surface of the word line 10 (see FIG. 3). The barrier layer 31C is formed, for example, under the deposition time exceeding the incubation time $t_1$. Thus, the thickness $W_3$ of a portion formed on the end surface of an insulating film 41 is thinner than the thickness $W_2$ of other portion formed on the end surface of the word line 10, thereby reducing the leakage current $I_L$ between the word lines 10.

Second Embodiment

Figure 7:
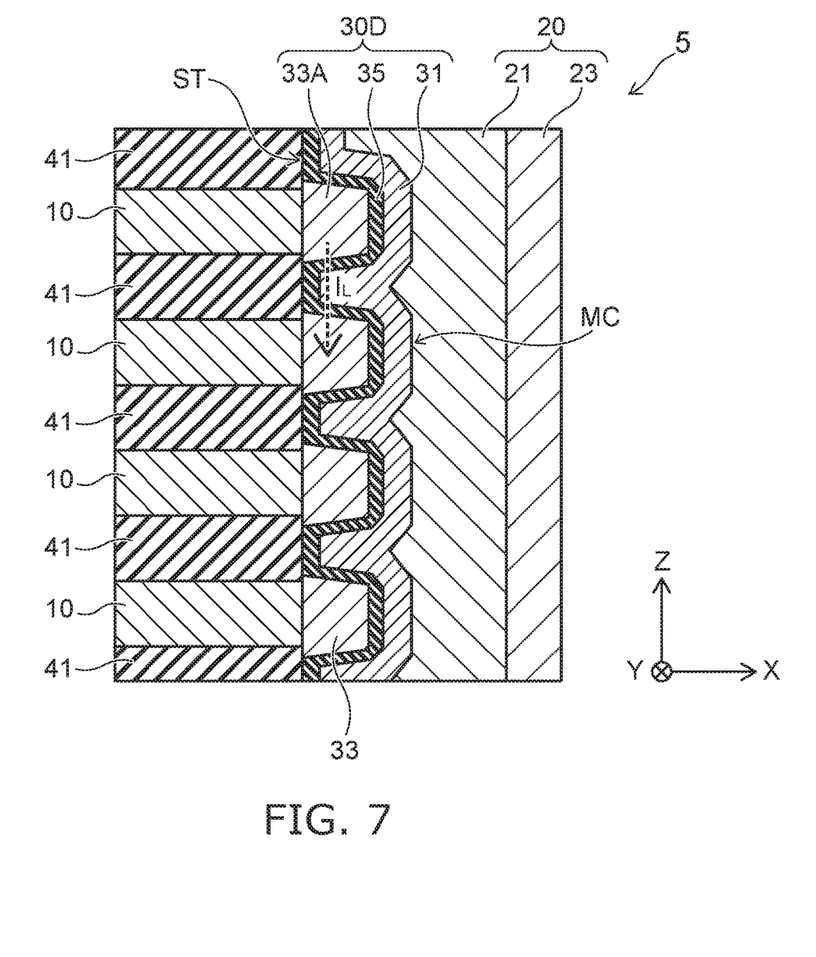
FIG. 7 is a schematic sectional view showing a part of a memory device according to a second embodiment.

FIG. 7 is a schematic sectional view showing a part of a memory device 5 according to a second embodiment. As shown in FIG. 7, the memory device 5 includes a resistance change film 30D positioned between word lines 10 and a local bit line 20. The resistance change film 30D includes a barrier layer 31, oxide film layers 33A, and an intermediate layer 35. The barrier layer 31 is, for example, an α-Si layer. Further, the barrier layer 31 may contain at least one of silicon, silicon oxide, aluminum oxide, and hafnium oxide. The oxide film layers 33A each contain, for example, $TiO_2$ or $WO_3$.

The barrier layer 31 is positioned between the local bit line 20 and the intermediate layer 35, and each oxide film layer 33A is positioned between a word line 10 and the intermediate layer 35. The oxide film layers 33A are selectively provided on the end surfaces of the word lines 10. The oxide film layers 33A are, for example, arranged separately from each other on the wall surface of a slit ST.

The barrier layer 31 has a resistance higher than a resistance in each oxide film layers 33A, and the intermediate layer 35 is an insulating layer. The total thickness of the respective barrier layers 31 and the intermediate layer 35 is set to a thickness so that an electron can tunnel from the oxide film layer 33A to the word line 10.

For example, when the potential of the local bit line 20 is set lower than the potential of a word line 10, a negative oxygen ion in the oxide film layer 33A is attracted toward the word line 10, and an electronic state changes in the vicinity of an interface between the oxide film layer 33A and the intermediate layer 35. Thereby, the electron tunneling through the barrier layer 31 and the intermediate layer 35 is suppressed, and the resistance change film 30D transits from a low-resistance state to a high-resistance state.

In contrast, when the potential of the local bit line 20 is set higher than the potential of the word line 10, a negative oxygen ion in the oxide film layer 33A returns toward the intermediate layer 35. Thereby, the electronic state in the vicinity of the interface between the oxide film layer 33A and the intermediate layer 35 changes so that an electron can tunnel through the barrier layer 31 and the intermediate layer 35. Therefore, the resistance change film 30D transits from a high-resistance state to a low-resistance state.

In the memory device 5, a plurality of oxide film layers 33A is provided separately from each other, and thus, the leakage current $I_L$ between the word lines 10 can be suppressed. Thereby, reading out the erroneous data from the memory cell MC can be avoided, and power consumption is also reduced.

Figure 8:
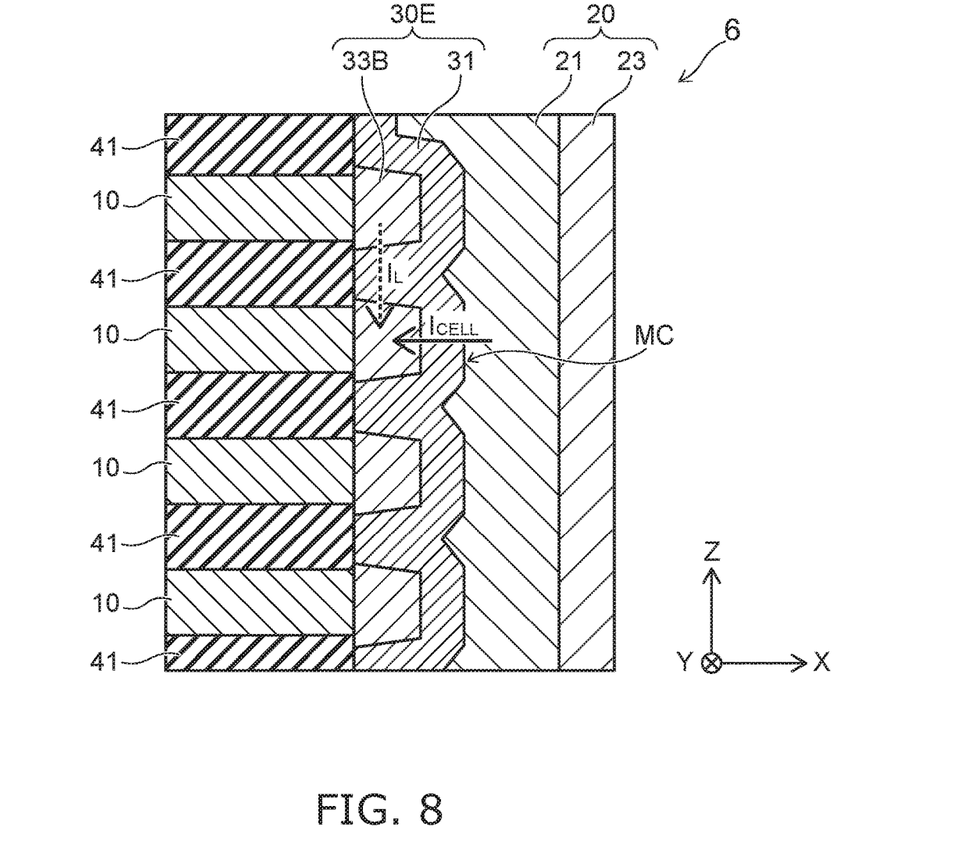
FIG. 8 is a schematic sectional view showing a part of a memory device according to a variation of the second embodiment.

FIG. 8 is a schematic sectional view showing a part of a memory device 6 according to a variation of the second embodiment. As shown in FIG. 8, the memory device 6 includes a resistance change film 30E positioned between word lines 10 and a local bit line 20.

The resistance change film 30E includes a barrier layer 31 and a plurality of oxide film layers 33B. The oxide film layers 33B are arranged separately from each other on the end surfaces of the word lines 10. The respective oxide film layers 33B contain, for example, $TiO_2$ or $WO_3$.

In this example, an intermediate layer 35 is not provided, and the barrier layer 31 is in contact with the oxide film layers 33B. Thereby, the leakage current $I_L$ between the word lines 10 can be suppressed, and also a cell current $I_{CELL}$ flowing through the memory cell MC can be enlarged. As a result, it is possible to improve the accuracy of reading data out from the memory cell MC.

Further, in the memory device 5 and 6, the barrier layer 31 is formed so as to have a cross-section of trapezoidal shape. Thereby, the step coverage of the oxide film layer 33B and the intermediate layer 35 is improved, and it is possible to reduce the variation in the cell current $I_{CELL}$.

The memory devices 2 to 6 described in the above-mentioned first embodiment and second embodiment may have, for example, the structure same as the memory device 1 shown in FIG. 1 except for the resistance change films 30B to 30E. Further, the mechanism that the resistance change film 30 transits from a low-resistance state to a high-resistance state, and the reverse thereof is illustrated by an example, and a mechanism different from the above-mentioned examples may be adopted. Further, a method for selectively forming the barrier layer 31 or the oxide film layer 33 on the end surface of the word line 10 is not limited to the embodiment using the incubation time, and another method may be used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A memory device comprising:
   a plurality of first interconnects extending in a first direction;
   a second interconnect extends in a second direction, and crossing the plurality of first interconnects;
   an insulating film provided between two first interconnects of the plurality of first interconnects, the two first interconnect being adjacent to each other in the second direction; and
   a resistance change film provided between the plurality of first interconnects and the second interconnect and between the insulating film and the second interconnect, the resistance change film reversibly transiting between a first resistance state and a second resistance state having a resistance higher than a resistance of the first resistance state,
   the resistance change film includes a first layer and a second layer, the first layer being positioned between the plurality of first interconnects and the second interconnect, and extending in the second direction along the second interconnect, and the second layer including a first portion and a second portion, the first portion positioned between the first layer and the respective first interconnects, and the second portion being positioned between the first layer and the insulating film, and
   the first portion having a thickness in a third direction from the respective first interconnects toward the second interconnect, the thickness of the first portion is thicker than a thickness in the third direction of the second portion,
   wherein the resistance change film further includes a third layer positioned between the first layer and the second layer, the third layer being electrically insulative and extending in the second direction along the first layer.

2. The device according to claim 1, wherein at least one of the first layer and the second layer includes a metal oxide.

3. The device according to claim 1, wherein
   the first layer includes titanium oxide or tungsten oxide, and
   the second layer includes at least one of amorphous silicon, silicon oxide, aluminum oxide, or hafnium oxide.

* * * * *